GYROMAGNETIC RESONANCE FILTER AND AMPLITUDE LIMITER

Filed May 13, 1953

INVENTOR.
RUSSELL H. VARIAN
BY Paul B. Hunter
ATTORNEY 3,147,427

GYROMAGNETIC RESONANCE FILTER AND AMPLITUDE LIMITER

Russell H. Varian, Cupertino, Calif., assignor to Varian Associates, San Carlos, Calif., a corporation of California Filed May 13, 1953, Ser. No. 354,745
6 Claims. (Cl. 324—.5)

This invention relates, generally, to novel gyromagnetic resonance apparatus and method and, more particularly, to novel apparatus and method utilizing gyromagnetic bodies such as nuclei in matter for providing radio frequency filters and amplitude limiters having unique properties.

A need exists, for example, in radar systems for a combination electrical filter and limiter which will possess, among other features, the following properties: (*a*) the filter and limiter must accept and pass all frequencies over a band of frequencies of considerable width, rejecting those frequencies above and below this band, (*b*) it must limit the amplitude of the output of the signals received at each frequency, if above a certain optimum input value, to a definite limit, and (*c*) it must not affect the amplitude of any signal having a frequency other than the signals with input amplitude above that of the optimum value. A possible solution to this problem presents itself in the use of a filter and limiter system comprising a very large number of individual and highly selective electronic vacuum tube type filter and limiter circuits connected in multiple. The resonant frequency bands of these filter circuits would necessarily be continuously distributed in frequency, the frequency bands overlapping. Because of the extremely wide overall frequency band desired to be covered, the number of individual resonant filter circuits would be very large. Considering the elements that would go into each individual filter and limiter, the size and cost of such a filter and limiter system is awe-inspiring, and the chance that all would function simultaneously is very doubtful.

One object of this invention is to provide a novel electrical circuit limiter element comprising gyromagnetic bodies such as nuclei in matter adapted for use in circuits and systems, such as, for example, radar systems.

Another object is to provide a novel wide radio frequency band filter which may have any arbitrary pass band shape including sharp cutoffs and which comprises gyromagnetic bodies in matter such as, for example, nuclei.

Another object is to provide a novel wide radio frequency band amplitude limiter which comprises gyromagnetic bodies such as nuclei in matter.

Still another object is to provide a novel wide radio frequency band combination filter and amplitude limiter which comprises gyromagnetic bodies such as nuclei in matter which, for example, may be utilized in radar systems.

Another object is to provide a novel wide radio frequency band amplitude limiter comprising gyromagnetic bodies such as nuclei in matter which will limit the amplitude of certain frequencies while not affecting certain closely adjoining frequencies.

Another object is to provide a novel amplitude limiter comprising gyromagnetic bodies such as nuclei which produces no harmonics of the limited frequency.

Still another object is to provide a novel amplitude limiter comprising gyromagnetic bodies such as nuclei in which the amplitude of the output signal is proportional to the amplitude of the input signal for all values of input amplitude considerably less than a certain optimum value and inversely proportional for all values of input amplitude considerably above the optimum value.

Other objects and advantages will become apparent from the following specification taken in connection with the accompanying drawings wherein FIG. 1 depicts the action of an ensemble of nuclei which possess the properties of gyroscopic moment and magnetic moment in a unidirectional magnetic field.

This invention utilizes gyromagnetic resonance, described in U.S. Patent 2,561,489 issued July 24, 1951, to Felix Bloch and William W. Hansen, now U.S. Patent Re. 23,950, issued February 22, 1955, and also described in articles by Bloch and by Bloch, Hansen and Packard both appearing in vol. 70 of the Physical Review, pages 460 and 474, respectively, October 1 and 15, 1946, and also in an article by Bloembergen, Purcell and Pound appearing in vol. 73 of the Physical Review, page 679. In Patent Re. 23,950, gyromagnetic resonance was described with reference to nuclei and nuclear induction and that pattern will be followed here also. As used herein, the terms "gyromagnetic bodies" or "gyromagnetic resonators" mean those bodies possessing the properties of gyroscopic moment and magnetic moment, while the term "gyromagnetic resonance" means resonance of gyromagnetic bodies.

Figure 1:
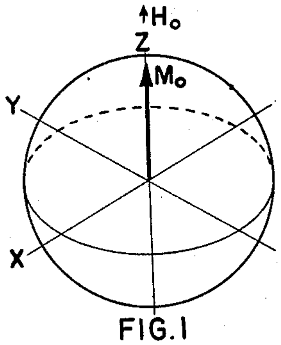
Figure 2:
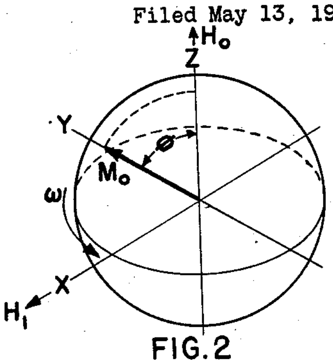
FIG. 2 shows the nuclei and field shown in FIG. 1 at a time when a rotating magnetic field is applied to the nuclei at right angles to the unidirectional field.

Two important properties of a nucleus are spin or gyroscopic moment I and magnetic moment $\mu$. Nuclei of the same atoms have a definite value of $$\frac{\mu}{I}$$

different and distinct from nuclei of any other atoms. FIGS. 1 and 2 shows diagrammatically the action of an ensemble of nuclei having a resultant moment $M_0$ when first placed in a unidirectional field $H_0$ (FIG. 1) and the subsequent action when a rotating magnetic field $H_1$ excites the ensemble (FIG. 2). When the nuclei of a particular atom are placed in a constant homogeneous unidirectional polarizing magnetic $H_0$, the nuclei, rather than line up in the direction of this field, will begin to precess in this field $H_0$ due to their spin and magnetic moment. If no polarization of the nuclei existed, that is, there were equal numbers of nuclei with spins parallel and anti-parallel to $H_0$, the application of the rotating field component $H_1$ would supply energy to those nuclei which were parallel to $H_0$ and thus transfer them to the higher energy anti-parallel state, but those in the anti-parallel state will be transferred to the lower energy parallel state by delivery of energy back to the rotating field component $H_1$. Thus there is no net interchange of energy between the nuclei and $H_1$. As might be expected under these conditions there is no observable external effect of the mass motion of these nuclei. If, however, the number of nuclei in the parallel direction is greater than that in the anti-parallel direction, there will be a net absorption of energy from $H_1$ when the resonant frequency is reached, and there will also be a measurable rotating component of magnetic field due to the preponderance of nuclei polarized parallel to the field $H_0$. The polarization due to $H_0$ is always small, but it is significant and is proportional to $H_0$.

The angular rate of the precessing nuclei, called the Larmor frequency, is proportional to $$\frac{\mu H_0}{I}$$

and, since nuclei of different atoms have different and distinct values of $$\frac{\mu}{I}$$

then nuclei of different atoms would precess in the same field $H_0$ at different and distinct Larmor frequencies. Besides being true for nuclei of different atoms, this is also true of different gyromagnetic bodies in general.

Figure 3:
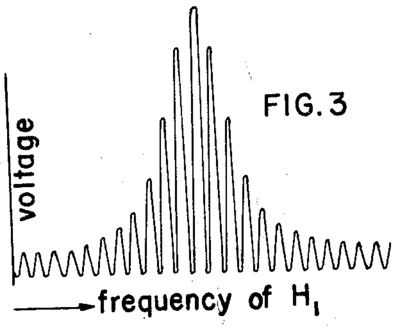
FIG. 3 shows the high frequency signal voltage induced in a coil located at right angles to the unidirectional field due to an ensemble of nuclei rotating in the plane of the rotating magnetic field.

Due to damping forces, the angle $\theta$ that the axis of the precessing preponderance of nuclei makes with the vertical field $H_0$ decreases until such time as the precessing nuclei, represented by the vector $M_0$, line up with the field (FIG. 1), the elapsed time being called the relaxation time. If, after the said preponderance of nuclei have lined up with the field $H_0$, a component of magnetic field $H_1$ of a certain optimum strength or amplitude is placed at right angles to the constant field $H_0$ with orientation which rotates about $H_0$ with uniform angular velocity $\omega$ of radio frequency, as may be furnished in the case of nuclear resonance of a transmitter coil located at right angles to the field $H_0$ as shown in the above cited patent, this magnetic field $H_1$ causes the nuclei $M_0$ to again precess about the field $H_0$, this time at the angular rate $\omega$ of the rotating component of field $H_1$ and in a plane perpendicular to the plane defined by the two fields (FIG. 2). The nuclei rotate coherently or in unison and may be thought of at this time as being resolved into one nucleus having the combined characteristics and effects of the rotating nuclei. The angle $\theta$ that the precessing nuclei make with the vertical field $H_0$ is determined by the angular velocity $\omega$, the angle being small for all values of $\omega$ less or greater than $\omega_0$. When the angular velocity $\omega$ closely approaches and equals the angular velocity $\omega_0$ of the Larmor frequency, the angle $\theta$ increases rapidly to 90°. A receiver coil placed at a 90° angle to the constant field $H_0$ will have induced in it a voltage of a certain maximum value due to the nuclei precessing at the Larmor frequency, the action being analogous to a bar magnet being swept past a coil. A typical induced signal is shown in FIG. 3 as the Larmor frequency is swept through resonance. This induced signal may be measured and used to indicate that the angular frequency $\omega$ at which the nuclei are processing is in fact the Larmor frequency $\omega_0$. There is a loss of gain through this nuclear resonance apparatus but the output signal may be subsequently passed through suitable amplifiers to increase it to any desired gain.

If the rotating component of magnetic field $H_1$ has an amplitude or strength less than the optimum value, the nuclei will precess at the Larmor frequency when the angular velocity $\omega$ equals the angular velocity $\omega_0$ of the the Larmor frequency, but the angle $\theta$ will not increase to 90° but will remain at some value less than 90°. Therefore, the voltage induced in the receiver coil will be less than that induced when the amplitude of $H_1$ is of the optimum value. As the amplitude of the field $H_1$ approaches more closely to the optimum value, the angle $\theta$ will approach more closely to the 90° angle with respect to the magnetic field $H_0$ and the voltage induced in the receiver coil will vary as sin $\theta$. As the amplitude of $H_1$ is increased beyond the optimum value, the phenomenon of "saturation" sets in which, basically, rests upon the fact that the nuclei, on the average, can take up more energy from the driving field $H_1$ than they are able to give up by thermal agitation to the molecules in the sample substances. As the magnitude of the field $H_1$ is increased beyond the optimum value, the agitated nuclei act less and less coherently and, consequently, the voltage induced in the receiver coil by any given group of nuclei when $H_1$ is far beyond optimum decreases in linear fashion from the maximum value of voltage.

The above described action takes place in a magnetic field $H_0$ which is as close to being uniformly homogeneous as it is possible to produce. In such a homogeneous field, like nuclei will resonate at or near only one particular Larmor frequency dependent on the strength of the field $H_0$ and the particular atom. If the frequency of the driving magnetic field $H_1$ is not the Larmor frequency or very close thereto, gyromagnetic resonance will not occur and there will be no voltage induced in the receiver coil.

The present invention involves the use of a magnetic field $H_0$ which is uniformly heterogeneous or, in other words, which varies in strength in a prescribed uniform manner over the volume occupied by the nuclei-containing matter. The nuclei in the field $H_0$ are similar but, remembering that the Larmor frequency is proportional to $$\frac{\mu}{I} H_0$$

a first group of nuclei located in a portion of the field $H_0'$ which is stronger than a portion of the field $H_0''$ in which another group of nuclei are located will resonate at a higher Larmor frequency than the nuclei in said other group. If the nuclei-containing matter is distributed in a proper manner in the entire magnetic field $H_0$, there will be different nuclei that will resonate at every frequency over a wide band of frequencies. The width of the band is determined by the minimum and maximum values of strength of the magnetic field $H_0$. If now the transmitter coil at right angles to the magnetic field $H_0$ is energized by a number of signals of different frequencies, a like number of corresponding signals of the same frequencies will be induced in the receiver coil. When the amplitudes of the received signals are each of the optimum amplitude, the corresponding induced voltages will have maximum amplitudes. Since in the case of nuclear resonance the resonance widths of individual nuclei may be a small fraction of a cycle, whereas the bandwidth provided by the graded magnetic field previously mentioned can be of the order of hundreds of thousands of cycles, it is clear that the number of individual resonators which are separate and distinct from each other may be of the order of 1,000,000. When the amplitudes of the signals received by the transmitter coil are less than the optimum value referred to above, the amplitudes of the corresponding signals induced in the receiver coil by the precessing nuclei will be less than the possible maximum values. If any one or more of the input signals should reach the optimum value, the corresponding induced signals in the receiver coil will reach their maximum amplitude. Should the amplitude of any of the input signals increase above the optimum value, the amplitude of the corresponding induced signal will decrease from the maximum value. It should be noted that although the amplitude of the voltage induced in the receiver coil is decreased from the maximum value as the amplitude of the input signal is increased, the other simultaneously induced signals of different frequencies are not limited or affected in any way unless the corresponding received signals are higher than the optimum value in their own right.

Figure 4:
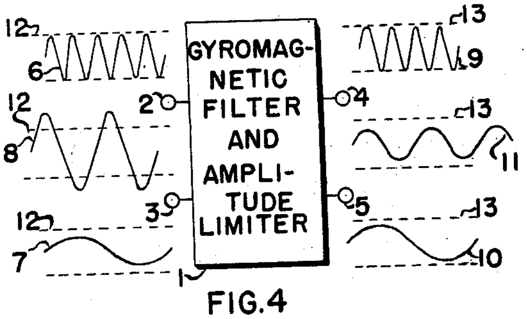
FIG. 4 depicts the operation of this invention in block diagram form.

Referring to FIG. 4, the operation of this invention is shown therein in block diagram form. The gyromagnetic filter and amplitude limiter is shown as a block 1 having input terminals 2 and 3 and output terminals 4 and 5. Three different input signals 6, 7 and 8 are shown for illustration purposes and also three output signals 9, 10 and 11 corresponding to the input signals 6, 7 and 8, respectively. These signals may be transmitted to the block in succession or simultaneously. The optimum values of amplitude of the input signals are represented by dotted lines 12. The maximum values of amplitude of the output signals are represented by dotted lines 13. Each of the input signals 6, 7 and 8 are of different frequencies and are shown having different values of amplitude. Input signal 6 has an amplitude of the optimum value. Its corresponding output signal 9 is of the same frequency and its amplitude is of the maximum value. Input signal 7 has an amplitude less than the optimum value. The corresponding output signal 10 is of the same frequency as signal 7 and has an amplitude less than the maximum value 13. The value of the amplitude of input signal 8 is greater than the optimum value and the value of the amplitude of its corresponding output signal 11 is lower than the maximum value 13. Depending on the gyromagnetic material and the apparatus used, this invention will work with frequencies ranging from 2 or 3 megacycles to as high as 20–50 megacycles and any one embodiment will accept frequencies over bandwidths of hundreds of thousands of cycles. Because of the characteristics of gyromagnetic resonators, there will be no harmonics of the input frequencies transmitted to the output. A remarkable aspect of this invention is that a signal only a relatively few cycles away from a signal which has been drastically limited will be transmitted to the output without being limited.

Figure 5:
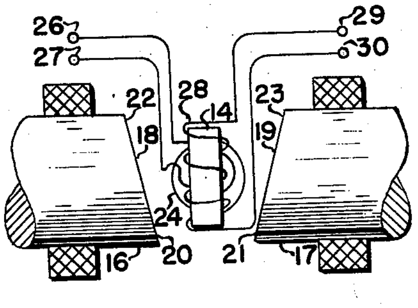
FIG. 5 shows one embodiment of this invention employing nuclei as the gyromagnetic bodies or resonators.

One embodiment of this invention is disclosed in FIG. 5. The nuclei-containing matter, such as water or a hydrocarbon which contains a large number of hydrogen nuclei which give very narrow lines, is located in a suitable container 14 between the poles 16 and 17 of an iron core magnet. Nuclei other than hydrogen or other gyromagnetic bodies may be used in other embodiments of this invention, if desired. The pole faces 18 and 19 of the magnet have uniformly slanting surfaces, the lower circumferal edges 20 and 21 of the pole faces being closer together than the upper circumferal edges 22 and 23. The field strength varies in a uniform manner from the bottom to the top of the sample in the gap from values such as, for example, 7025 to 6975 gauss, the field being strongest at the bottom. Another type of magnet which may be used has parabolic shaped pole faces, in which case the strongest portion of the magnetic field is in the center of the pole face, the strength decreasing radially outward from the center of the pole face. Another method for varying the field strength involves the use of electric coils or shims in the pole faces where variations of current in the coils will vary the strength of the field.

The transmitter coil 24 is positioned relative to the pole faces so as to produce a component of magnetic field at right angles to the unidirectional field. The ends of the transmitter coil 24 are connected to the input terminals 26 and 27 to which the various radio frequency input signals are transmitted. The receiver or pickup coil 28 is placed around the matter in container 14 and is connected to the output terminals 29 and 30. The receiver coil 28 is positioned accurately at right angles to the transmitter coil 24 and has induced in it signal voltages corresponding to the input signals due to the precessing nuclei in the matter. The values of the frequency of these input signals cover a band of frequency of about 200 kilocycles, the mid-frequency being approximately 30 megacycles, the precessing nuclei having resonant frequencies distributed over the same band.

Figure 6:
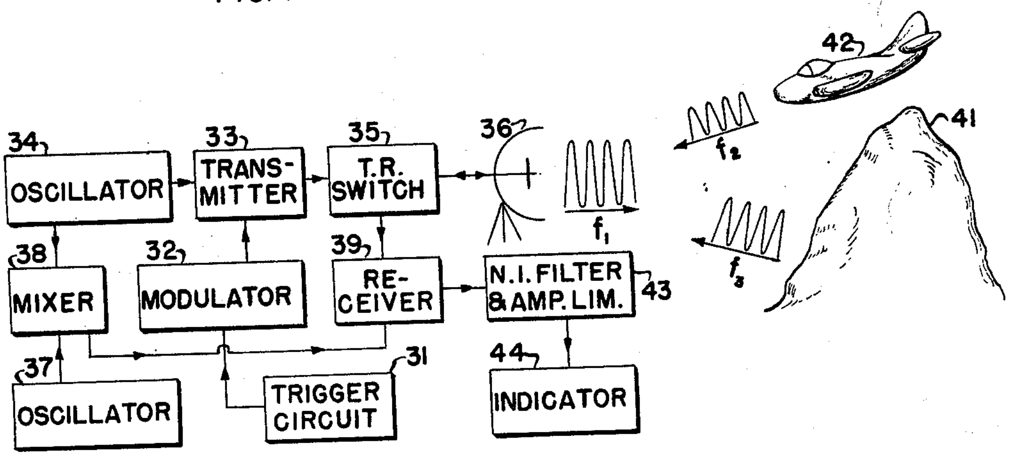
FIG. 6 shows the block diagram of a novel radar system which utilizes one embodiment of this invention.

One practical use for this novel invention is in radar systems of the moving target indicator class where the Doppler shift in frequencies of the return signals is utilized to distinguish between stationary and moving objects or targets. An example of a radar system of this type utilizing this invention is shown in block diagram in FIG. 6. The timer or trigger circuit 31 produces a trigger signal or pulse which is transmitted to the modulator 32 where the trigger pulse is transformed into a rectangular voltage pulse of extremely short duration. This pulse modulates the high frequency energy in the transmitter 33 produced by the oscillator 34, this short pulse of high frequency energy being transmitted through the transmit-receive (TR) switch 35 to the antenna 36 and then out into space. A portion of the high frequency energy from the oscillator 34 is "beat" by the output signal from another oscillator 37 in the mixer 38 to obtain a suitable frequency signal from the mixer 38 for beating the received echo signals in the receiver 39 to produce output signals from the receiver 39 of the desired frequencies. The echo signals from the stationary and moving objects are picked up by the antenna 36 and transmitted through the TR switch 35 to the receiver 39. The echo signal $f_3$ from the stationary objects is beat by the signal from the mixer 38 to give the desired output signal, for example, 30 megacycles, to the nuclear induction filter and amplitude limiter 43. The echo signals $f_2$ from moving objects are different in frequency from the echo signals from stationary objects, the shift in frequency being dependent upon the velocity and direction of the moving objects. Thus Doppler shifted echo signals are also beat in the receiver 39 to give an output signal from the receiver of frequencies slightly less than or greater than the corresponding set of frequencies of stationary objects. If, for example, one of the stationary objects is a mountain 41 and a moving object is an aircraft 42, the power reflected from the mountain will be much higher than the power reflected from the aircraft. Therefore, these two different frequency signals transmitted to the nuclear induction filter and amplitude limiter 43 will be of different strength and, by selection of suitable parameters in the filter and amplitude limiter, the amplitude or strength of the input signal due to the mountain will be well over the optimum value of input amplitude, while the signal from the airplane will be of the optimum value. Thus the output from the filter and amplitude limiter will be at maximum strength for the aircraft while the output due to the mountain will be well below maximum strength. The output from the nuclear induction filter and limiter 43 is transmitted to a suitable indicator 44 such as an A scope or a Plan Position Indicator (PPI) or other types of indicators which will give velocity readings.

Since many changes could be made in the above construction of the novel nuclear induction filter and amplitude limiter and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A gyromagnetic resonance filter and amplitude limiter including, in combination, matter comprising gyromagnetic bodies, means for producing in a heterogeneous unidirectional magnetic field enveloping said matter such that different incremental volumes of said matter are located in magnetic fields of different strengths, the Larmor frequencies of the different incremental volumes thus being different, means arranged for providing an input signal composed of a plurality of alternating magnetic fields of different relative amplitudes to said matter substantially at right angles to said unidirectional field, certain of said bodies thereupon precessing in said unidirectional field at their Larmor frequency in resonance with one of said alternating magnetic fields and certain other of said bodies precessing in said unidirectional field at their Larmor frequency in resonance with another of said alternating magnetic fields, said precessing gyromagnetic bodies providing a resultant electromagnetic signal composed of a plurality of alternating magnetic fields substantially at right angles to said unidirectional and input alternating fields, the amplitude of said resultant magnetic fields being linearly related to the amplitudes of the corresponding input magnetic fields when the input amplitudes are below a saturation value, said resultant magnetic fields being limited in amplitude relative to said input signals when the amplitudes of said input signals are greater than said saturation amplitude, and means for receiving said resultant electromagnetic signal.

2. Gyromagnetic precessional apparatus for differentially amplifying an intense electromagnetic signal and a weaker electromagnetic signal having different but overlapping frequency spectra which comprises gyromagnetic medium having gyromagnetic bodies therein and having an input and an output coupled by the precessional motion of said gyromagnetic bodies, means for producing in said medium a graded magnetic field in which said bodies are aligned whereby the individual gyromagnetic bodies may achieve precessional resonance with said incoming signals at different frequencies, those bodies resonating at the frequency of said weaker signal precessing coherently and coupling in a linear manner relative to the amplitude of the incoming weaker signal, those bodies resonating at the frequency of said intense signal becoming saturated and precessing less coherently and coupling in a nonlinear, reduced manner relative to the amplitude of the incoming intense signal.

3. Apparatus as claimed in claim 2 wherein said gyromagnetic bodies are nuclei.

4. A gyromagnetic resonance filter and amplitude limiter including, in combination, matter comprising gyromagnetic bodies, means for producing a heterogeneous unidirectional magnetic field enveloping said matter such that a multiplicity of incremental volumes of said matter are located in magnetic fields of different strengths, the Larmor frequencies of the gyromagnetic bodies in the different incremental volumes thus being different, means arranged for providing an input signal composed of a plurality of alternating magnetic fields of different frequencies and different relative amplitudes to said matter substantially at right angles to said unidirectional field, said bodies thereupon precessing at their different Larmor frequencies in said unidirectional field in resonance with said alternating fields and providing an output signal composed of a plurality of radio frequency magnetic fields substantially at right angles to said unidirectional and alternating fields, the input signal frequencies having amplitudes exceeding a certain value producing saturation of the gyromagnetic bodies with Larmor frequencies at those frequencies and thus impairing resonance signal outputs at those frequencies such that said frequency signals are filtered out, and radio frequency energy translating means for receiving the filtered output signal.

5. The combination as claimed in claim 4 wherein said gyromagnetic bodies are nuclei.

6. A filter and amplitude limiter for filtering out and/or limiting the amplitude of relatively strong input signals comprising matter containing gyromagnetic bodies, means for producing a heterogeneous unidirectional magnetic field enveloping said matter whereby different groups of gyromagnetic bodies are located in different regions of magnetic field strength and thereby possess different values of Larmor frequency, means for applying the input signals to said matter in the form of a plurality of radio frequency magnetic fields and at an angle to said heterogeneous field, the input signals being of different frequencies and different relative amplitudes, said gyromagnetic bodies thereupon precessing at their different Larmor frequencies in said unidirectional field in resonance with said radio frequency input signals and providing an output signal composed of a plurality of radio frequency magnetic fields substantially at right angles to said unidirectional and alternating fields, those input signals having amplitudes which approach a certain value causing the gyromagnetic bodies with Larmor frequencies at the frequency of such signals to approach saturation and thus limit the resonance signal output at those frequencies, those other input signals having amplitudes which exceed said certain value producing saturation of the gyromagnetic bodies with Larmor frequencies at the frequencies of those signals and thus impairing resonance signal outputs at those frequencies such that said frequency signals are filtered out, and radio frequency energy translating means for receiving the resultant filtered output signal, weak input signals thus being transmitted through said filter and amplitude limiter while stronger input signals are limited in amplitude and/or filtered out completely.

References Cited in the file of this patent

UNITED STATES PATENTS

| | | |
|---|---|---|
| 2,431,854 | Wood | Dec. 2, 1947 |
| 2,535,274 | Dicke | Dec. 26, 1950 |
| 2,589,494 | Hershberger | Mar. 18, 1952 |
| 2,659,078 | Sherr | Nov. 10, 1953 |
| 2,743,366 | Hershberger | Apr. 24, 1956 |
| 2,764,676 | Bradley | Sept. 25, 1956 |
| 2,820,944 | Bradley | Jan. 21, 1958 |

OTHER REFERENCES

Bloembergen et al.: Physical Review, vol. 73, No. 7, pp. 679–712, Apr. 1, 1948.

Zimmerman, et al.: Physical Review, vol. 76, No. 3, Aug. 1, 1949, pp. 350 to 357.

Levinthal: Physical Review, vol. 78, No. 3, pp. 204–213, May 1, 1950.

Williams: Physica XVII, Nos. 3–4, March-April 1951, pp. 454 to 460.

UNITED STATES PATENT OFFICE

CERTIFICATE OF CORRECTION

Patent No. 3,147,427 September 1, 1964

Russell H. Varian

It is hereby certified that error appears in the above numbered patent requiring correction and that the said Letters Patent should read as corrected below.

Column 2, line 50, after "magnetic" insert -- field --; column 3, line 26, for "of a" read -- by a --.

Signed and sealed this 22nd day of June 1965.

(SEAL)
Attest:

ERNEST W. SWIDER
Attesting Officer

EDWARD J. BRENNER
Commissioner of Patents